United States Patent
Graham et al.

(10) Patent No.: US 9,701,119 B2
(45) Date of Patent: Jul. 11, 2017

(54) FLUID EJECTION CHIP INCLUDING HYDROPHILIC AND HYDROPHOPIC SURFACES AND METHODS OF FORMING THE SAME

(71) Applicant: Funai Electric Co., Ltd., Osaka (JP)

(72) Inventors: David C. Graham, Lexington, KY (US); David B. Rhine, Georgetown, KY (US); Sean T. Weaver, Union, KY (US); Christopher A. Craft, Paris, KY (US)

(73) Assignee: Funai Electric Co., Ltd., Osaka (JP)

(*) Notice: Subject to any disclaimer, the term of this patent is extended or adjusted under 35 U.S.C. 154(b) by 0 days.

(21) Appl. No.: 14/303,047

(22) Filed: Jun. 12, 2014

(65) Prior Publication Data
US 2015/0360466 A1    Dec. 17, 2015

(51) Int. Cl.
| | |
|---|---|
| B41J 2/135 | (2006.01) |
| B41J 2/14 | (2006.01) |
| B41J 2/16 | (2006.01) |
| B05D 5/04 | (2006.01) |
| C23C 16/04 | (2006.01) |
| C23C 16/40 | (2006.01) |
| B05D 5/08 | (2006.01) |
| B05D 1/32 | (2006.01) |

(52) U.S. Cl.
CPC .......... *B41J 2/1433* (2013.01); *B41J 2/1606* (2013.01); *C23C 16/045* (2013.01); *C23C 16/401* (2013.01); *C23C 16/403* (2013.01); *B05D 1/32* (2013.01); *B05D 5/08* (2013.01)

(58) Field of Classification Search
None
See application file for complete search history.

(56) References Cited

U.S. PATENT DOCUMENTS

| | | | | |
|---|---|---|---|---|
| 5,759,421 A | * | 6/1998 | Takemoto | B41J 2/1606 216/27 |
| 6,296,344 B1 | | 10/2001 | Sharma et al. | |
| 6,336,697 B1 | * | 1/2002 | Fukushima | B41J 2/14 347/20 |
| 2005/0241754 A1 | | 11/2005 | Iri et al. | |
| 2008/0136866 A1 | * | 6/2008 | Okamura | B41J 2/14233 347/45 |
| 2010/0078819 A1 | * | 4/2010 | Shin | H01L 23/525 257/751 |
| 2013/0169713 A1 | | 7/2013 | Takeuchi et al. | |

* cited by examiner

*Primary Examiner* — Lisha Jiang
(74) *Attorney, Agent, or Firm* — Amster, Rothstein & Ebenstein, LLP

(57) ABSTRACT

A fluid ejection chip and associated methods of forming are disclosed. According to an exemplary embodiment, the fluid ejection chip comprises a substrate, a flow feature layer, and a nozzle layer. The flow feature layer is disposed over the substrate and has an exposed hydrophilic surface layer with an ink contact angle of about 80 degrees. The nozzle layer is disposed over the flow feature layer and has a thickness of about 4 microns to about 8 microns and an exposed hydrophobic surface layer having an ink contact angle of about 115 degrees.

8 Claims, 4 Drawing Sheets

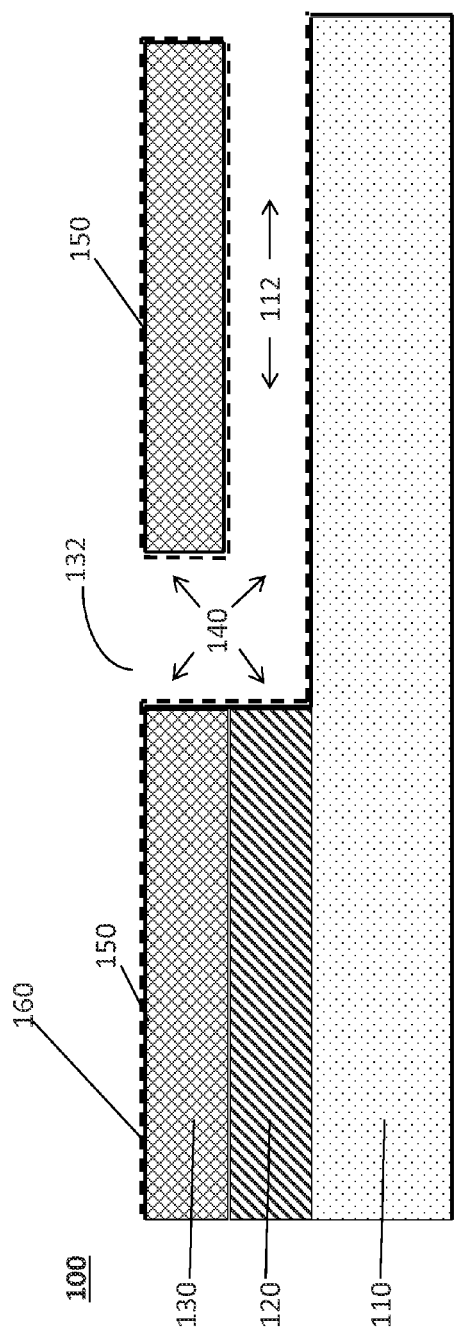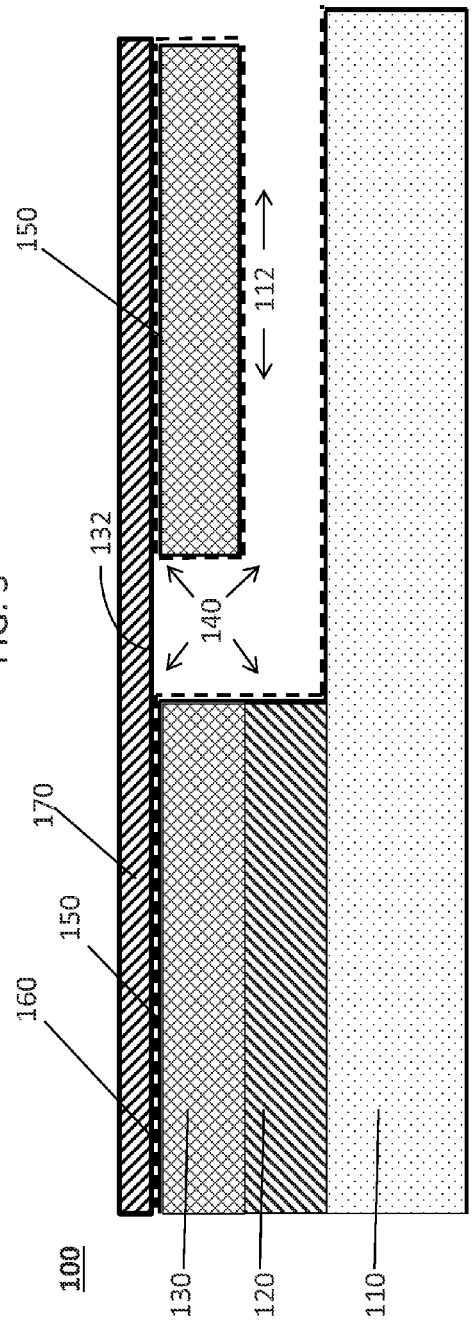

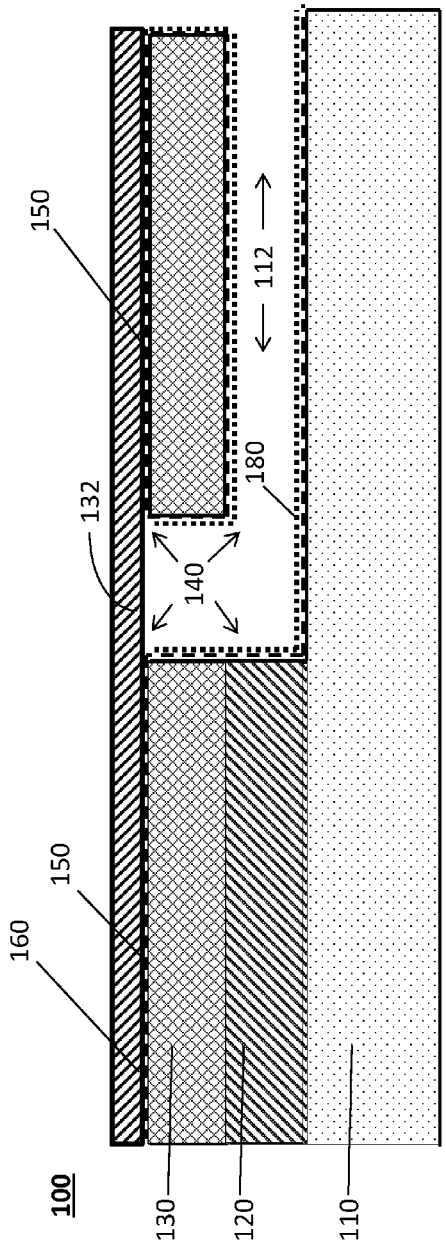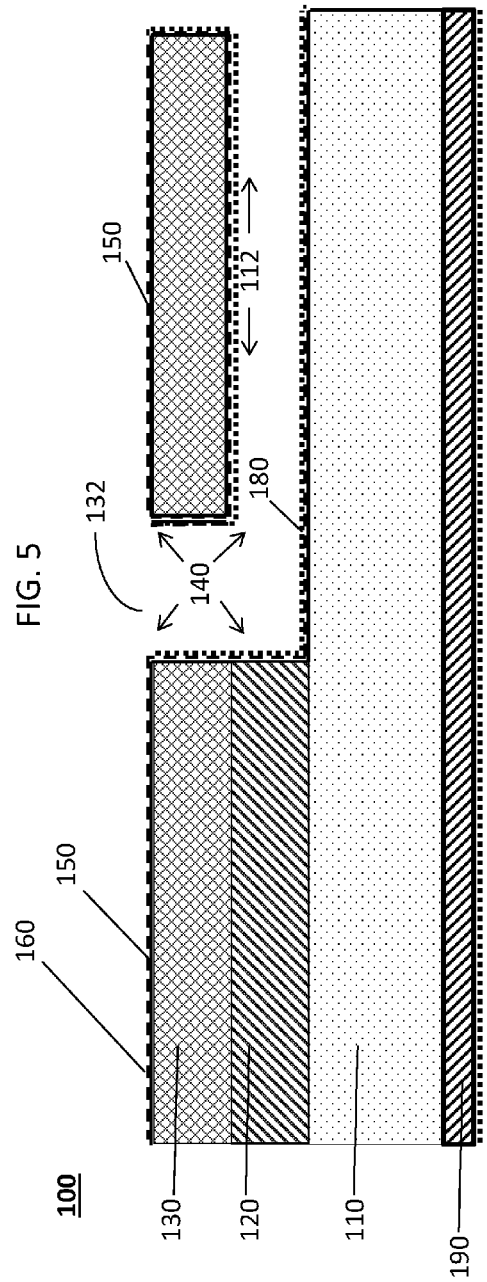

FLUID EJECTION CHIP INCLUDING HYDROPHILIC AND HYDROPHOPIC SURFACES AND METHODS OF FORMING THE SAME

FIELD

The present invention is directed to fluid ejection chips having components with hydrophobic and hydrophilic surfaces and methods of forming the same.

BACKGROUND

Printheads for inkjet printing systems often incorporate one or more ejection chips that include a layered semiconductor wafer substrate that is processed and/or treated to define structures for use in the thermal ejection of liquid ink from the printhead onto a medium, such as paper.

In some inkjet printing systems, a patterned plate forms the outermost layer of the ejection chip, and includes at least one nozzle aperture through which ink is ejected. Accordingly, ejection chips incorporate one or more interior pathways through which liquid ink flows prior to thermal ejection through the nozzle.

The degree of hydrophobicity and hydrophilicity, i.e., the affinity to repel or attract fluids, respectively, of portions of an ejection chip plays an important role in the overall performance of the ejection chip. For example, as the size of nozzles in nozzle plates shrink in order to achieve smaller ink droplet sizes, the sensitivity of the fluid ejected to the surface energy of the nozzle plate increases dramatically. One factor that may effect the ejection of fluids from the nozzle plate may be the accumulation of fluid or other contaminants on the nozzle plate surface. Such accumulation of fluid on the nozzle plate may adversely affect both the size and placement accuracy of the fluid droplets ejected from the ejection chip.

Further, it has been observed in operation of some inkjet printheads that the high temperatures and/or pressures associated with thermal ejection of liquid ink may result in the formation of bubbles of air or other gases within the ink as it travels along the interior pathways of the ejection chip prior to ejection. An abundance of such bubbles prior to thermal ejection of the liquid ink may result in sub-optimal performance of the inkjet printhead, for example, low printing quality, consistency, and/or density, to name a few.

SUMMARY

An object of the present invention is to provide an inkjet printhead that includes one or more ejections chips that incorporate at least a fluid chamber with a wettable surface having an affinity for attracting fluids, e.g., a hydrophilic surface, as well as a nozzle plate which has a fluid-resistant surface, e.g., hydrophobic surfaces, to inhibit the accumulation of residue on the nozzle plate.

Another object of the present invention is to provide ejection chips that include the hydrophilic surface of the fluid chamber as separate and distinct from the hydrophobic surface of a nozzle plate by forming the ejection chips of the inkjet printhead in an effective and efficient manner.

According to an exemplary embodiment of the present invention, a fluid ejection chip is disclosed that comprises a substrate, a flow feature layer, and a nozzle layer. The flow feature layer is disposed over the substrate and has an exposed hydrophilic surface layer with an ink contact angle of about 80 degrees. The nozzle layer is disposed over the flow feature layer and has a thickness of about 4 microns to about 8 microns and an exposed hydrophobic surface layer having an ink contact angle of about 115 degrees.

In an exemplary embodiment, the hydrophilic surface layer is a self-assembled monolayer formed of a silane material.

In an exemplary embodiment, the hydrophobic surface layer is a self-assembled monolayer formed of a silane material.

In an exemplary embodiment, the ejection chip further comprises a first surface layer in direct contact with each of the substrate, flow feature layer, and nozzle layer, and comprises a penetrant material.

In an exemplary embodiment, the first surface layer is an aluminum oxide material.

In an exemplary embodiment, the ejection chip further comprises a second surface layer in direct contact with the first surface layer.

In an exemplary embodiment, the second surface layer is a silicon oxide material.

In an exemplary embodiment, the nozzle layer is devoid of the hydrophilic surface layer.

According to an exemplary embodiment of the present invention, a method of coating a fluid ejection chip is disclosed, and comprises a substrate, a flow feature layer disposed over the substrate, and a nozzle layer comprising one or more nozzles disposed over the flow feature layer. The method comprises: applying a first masking layer in substantially planar abutment with a top surface of the nozzle layer; forming a hydrophilic layer at exposed surfaces of the fluid ejection chip; removing the first masking layer after formation of the hydrophilic layer; and forming a hydrophobic layer at one or more portions of the top surface of the nozzle layer.

In an exemplary embodiment, the method further comprises the step of forming a first layer over the fluid ejection chip prior to the step of applying the first masking layer.

In an exemplary embodiment, the step of forming the first layer comprises at least one of chemical vapor deposition (CVD), sputtering, spin coating, plasma deposition, atomic deposition, or physical vapor deposition (PVD).

In an exemplary embodiment, the method further comprises the step of forming a second layer over the first layer prior to the step of applying the first masking layer.

In an exemplary embodiment, the step of forming the second layer comprises at least one of chemical vapor deposition (CVD), sputtering, spin coating, plasma deposition, atomic deposition, or physical vapor deposition (PVD).

In an exemplary embodiment, the method further comprises the step of applying a second masking layer to a bottom surface of the substrate following removal of the first masking layer.

In an exemplary embodiment, the method further comprises the step of removing the second masking layer after formation of the hydrophobic layer.

In an exemplary embodiment, the method further comprises the step of removing the first masking layer results in exposure of a portion of the nozzle layer that is devoid of the hydrophilic layer.

BRIEF DESCRIPTION OF THE DRAWINGS

The features and advantages of the present invention will be more fully understood with reference to the following, detailed description of illustrative embodiments of the present invention when taken in conjunction with the accompanying figures, wherein:

FIG. 3 is a side cross-sectional view of the ejection chip of FIG. 1 having a second surface layer deposited thereon;

FIG. 4 is a side cross-sectional view of the ejection chip of FIG. 1 having a first masking layer deposited thereon;

FIG. 5 is a side cross-sectional view of the ejection chip of FIG. 1 having a hydrophilic layer deposited thereon;

FIG. 6 is a side cross-sectional view of the ejection chip of FIG. 5 with a portion of the third surface layer having been subsequently removed and a second masking layer deposited thereon;

DETAILED DESCRIPTION OF EMBODIMENTS

Figure 1:
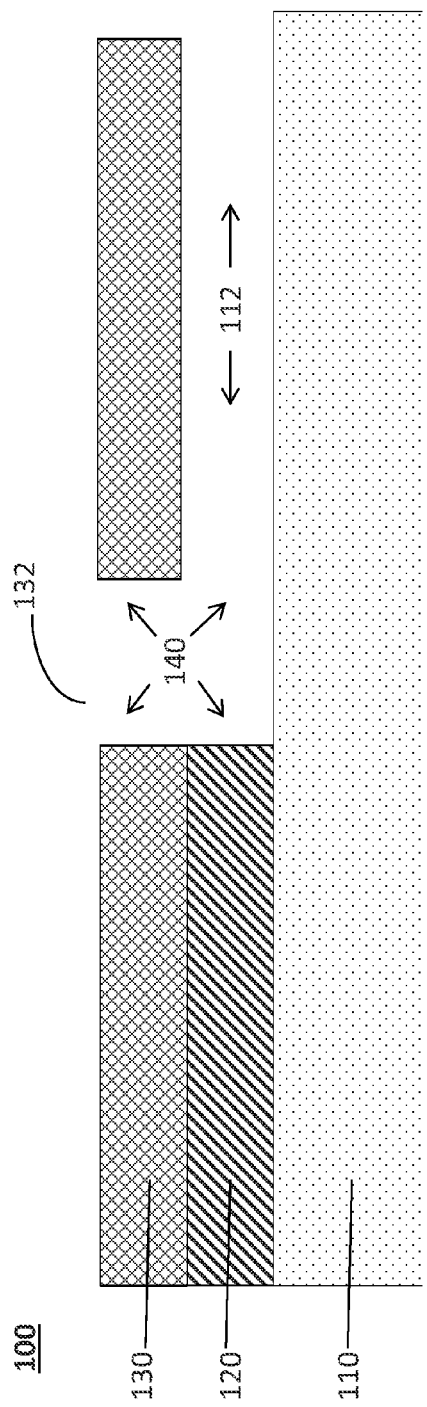
FIG. 1 is a side cross-sectional view of an ejection chip of an inkjet printhead according to an exemplary embodiment of the present disclosure.

The headings used herein are for organizational purposes only and are not meant to be used to limit the scope of the description or the claims. As used throughout this application, the words "may" and "can" are used in a permissive sense (i.e., meaning having the potential to), rather than the mandatory sense (i.e., meaning must). Similarly, the words "include," "including," and "includes" mean including but not limited to. To facilitate understanding, like reference numerals have been used, where possible, to designate like elements common to the figures.

In exemplary embodiments described herein, inkjet printheads are disclosed that include ejection chips having hydrophobic and hydrophilic surfaces. The presently-disclosed ejection chips are formed in a manner such that the hydrophobic and hydrophilic surfaces are selectively applied to portions of the ejection chip without unduly complicating the manufacturing process.

Referring to FIG. 1, an exemplary embodiment of an ejection chip of an inkjet printhead is shown in cross-sectional view and is generally designated as 100. Ejection chip 100 may have a layered configuration and include a substrate 110, a flow feature layer 120, and/or a nozzle layer 130. In embodiments, ejection chip 100 may include additional or alternative components to those described above in any combination or separation.

It will be understood that one or more ejector elements comprised of one or more conductive and/or resistive materials may be formed on the substrate 110 so that when electrical power is supplied, heat is accumulates on and/or near the ejector elements to cause the flash vaporization and ejection of liquid ink. In embodiments described herein, ejector elements will be understood to be present on a portion of the ejector chip 100, but will not be shown for ease of illustration.

Substrate 110 may be formed of a semiconductor material, such as a silicon wafer. During and/or after initial manufacture of the substrate 110, portions thereof may be processed into a desired configuration by various methods known in the art, such as, for example, mechanical deformation such as grinding, chemical etching, or patterning desired structures with photoresist, to name a few.

As shown, flow feature layer 120 is disposed over the substrate 110. Flow feature layer 120 may be disposed in a layered or otherwise generally planar abutting relationship with respect to substrate 110. Flow feature layer 120 may be formed of, for example, a polymeric material. Flow feature layer 120 may have geometry and/or dimensioning to facilitate the directed flow of liquid ink through ejection chip 100. In this regard, an interior fluid channel 112 may be formed within the flow feature layer 120 atop the substrate 110 so that fluids such as liquid ink may flow therealong. Interior fluid channel 112 may be placed in fluid communication with an ink reservoir or other source of liquid ink (not shown).

A nozzle layer 130 is disposed over the flow feature layer 120. In embodiments, nozzle layer 130 may be disposed in a layered relationship with flow feature layer 120. In embodiments, nozzle layer 130 may be formed of, for example, a polymeric material. Nozzle layer 130 may be processed such that one or more nozzles 132 are formed along a top surface of the nozzle layer 130. Nozzles 132 may be configured as exit apertures for ink being ejected from the ejection chip 100. Accordingly, nozzles 132 may have geometry and/or dimensioning configured to direct the trajectory of ink exiting the ejection chip 100. Interior-facing surfaces of the substrate 110, flow feature layer 120, and nozzle layer 130 near nozzles 132 together define a fluid chamber 140 from which liquid ink is propelled through nozzles 132 upon firing of the ejection chip 100.

Turning now to FIGS. 2, 3, 4, 5, 6, and 7, a method of forming a fluid ejection chip having desirable properties according to an exemplary embodiment of the present invention will be described.

Figure 2:
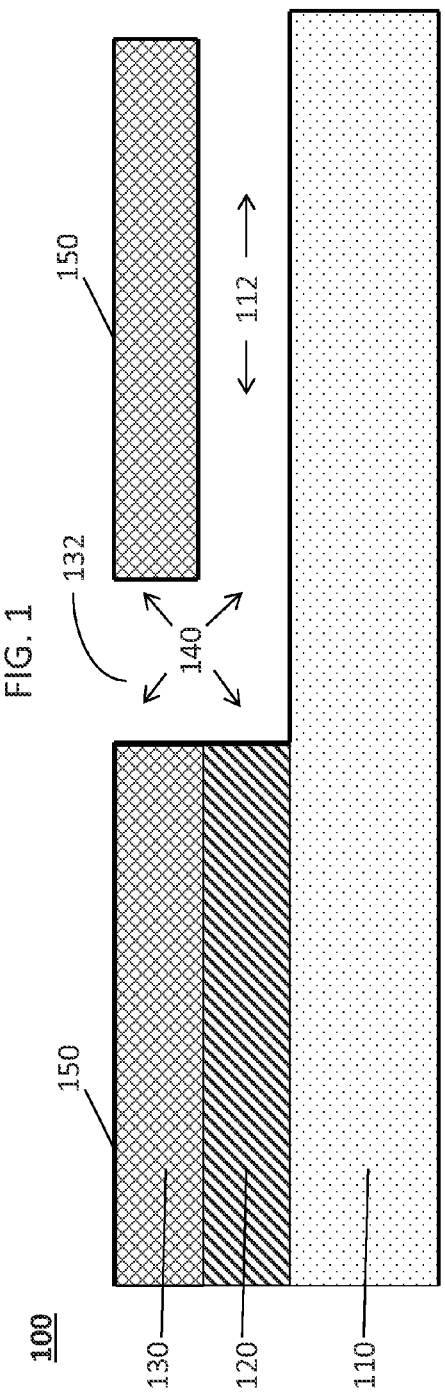
FIG. 2 is a side cross-sectional view of the ejection chip of FIG. 1 having a first surface layer deposited thereon.

With reference to FIG. 2, a first surface layer 150 is deposited along exposed surfaces of the ejection chip 100. First surface layer 150 may be comprised of a penetrant material that provides a surface upon which additional surface layers may be applied, as described further herein. In this manner, first surface layer 150 may be configured as a "seed" layer which provides a base, foundation, and/or supportive material for additional surface layers. In embodiments, first surface layer 150 may be comprised of an aluminum oxide material, for example, trimethylaluminum. First surface layer 150 may be deposited along the surface of the ejection chip 100 in a conventional manner known in the art, such as, for example, chemical vapor deposition (CVD), sputtering, spin coating, plasma deposition, atomic deposition, or physical vapor deposition (PVD), to name a few. As shown, first surface layer 150 is deposited in a manner that at least partially encapsulates the exposed surfaces of ejection chip 100. In embodiments, first surface layer 150 may partially or entirely encapsulate the ejection chip 100.

Turning to FIG. 3, a second surface layer 160 is deposited on the ejection chip 100 so as to at least partially encapsulate the exposed surfaces of ejection chip 100. In embodiments, second surface layer 160 may encapsulate and/or react with the first surface layer 150 such that second surface layer 160 provides a surface adapted to facilitate the adhesion, nucleation, and/or growth of molecules disposed thereon, as described further herein. In embodiments, second surface layer 160 may be comprised of a silicon oxide material, for example, 1, 2-bis(trichlorosilyl)ethane. As shown, second surface layer 160 may encapsulate the entire ejection chip 100. In embodiments, second surface layer 160 may overlie first surface layer 150 so that first surface layer 150 and second surface layer 160 are coextensive. In embodiments, second surface layer 160 may overlie exposed surface portions of ejection chip 100 that are devoid of first surface layer 150.

Turning to FIG. 4, a first masking layer 170 is applied over the ejection chip 100. However, as shown, first masking layer 170 is not uniformly deposited over each exposed surface of the ejection chip 100 as in the first layer 150 and second layer 160. Rather, first masking layer 170 is applied in substantially planar abutment with the nozzle layer 130 so that a portion of first masking layer 170 extends across or "bridges" the top of nozzle 132. Accordingly, first masking layer 170 may have an at least partially rigid construction and/or may be maintained in a substantially linear configuration across nozzle 132. In exemplary embodiments, first masking layer 170 may be comprised of a length of material, such as a length of tape comprised of a polymeric material such as polyvinylchloride (PVC), polyethylene, and/or polyolefin, to name a few. First masking layer 170 may be tensed along nozzle layer 130 such that the portion of first masking layer 170 extending across nozzle 132 is maintained in substantially linear alignment. Accordingly, first masking layer 170 is selectively applied to ejection chip 100 such that first masking layer 170 is applied in substantially planar abutment with the nozzle layer 130, but does not extend through nozzle 132 into fluid chamber 140.

Turning to FIG. 5, a hydrophilic layer 180 is formed over the exposed surfaces of the ejection chip 100 that are not covered by the first masking layer 170. Hydrophilic layer 180 is comprised of a hydrophilic material, i.e., a material that readily contacts and/or adheres to fluids. In the exemplary embodiment shown, hydrophilic layer 180 may be comprised of a self-assembled monolayer (SAM) formed by the adsorption, nucleation, and growth of organic molecules into a single layer, such as a silane material, for example, trimethylchlorosilane, pentafluorophenylpropyltrichlorosilane, and/or acetoxyethyltrichlorosilane, to name a few. In this manner, the hydrophilic layer 180 reacts with the second layer 160 to form a uniform layer encapsulating portions of the ejection chip 100 that are not covered with the first masking layer 170.

As shown, the presence of first masking layer 170 atop the nozzle layer 130 effectively prevents formation of the hydrophilic layer 180 on the upper exposed surface of the nozzle layer 130. Accordingly, first masking layer 170 provides an at least partial fluid barrier over nozzle layer 130. In this manner, the first masking layer maintains the unreacted second layer 160 atop the nozzle layer 130 during application of the hydrophilic layer 180.

Turning now to FIG. 6, first masking layer 170 is removed from the nozzle layer 130 so that the nozzle layer 130, still encapsulated by first layer 150 and/or second layer 160, forms the uppermost structure of ejection chip 100.

Optionally, a second masking layer 190 is applied to a bottom surface of the substrate 110. Second masking layer 190 is substantially similar to first masking layer 170 described above, e.g., a length of tape or other material. In embodiments, first masking layer 170 may be removed from the nozzle layer 130 in the manner described above and re-applied to the bottom surface of substrate 110 in lieu of the second masking layer 190. The second masking layer 190 may be selectively applied to portions of the hydrophilic layer 180 so as to protect those portions during subsequent processing steps, in the manner described above with respect to first masking layer 170, as described further herein.

Figure 7:
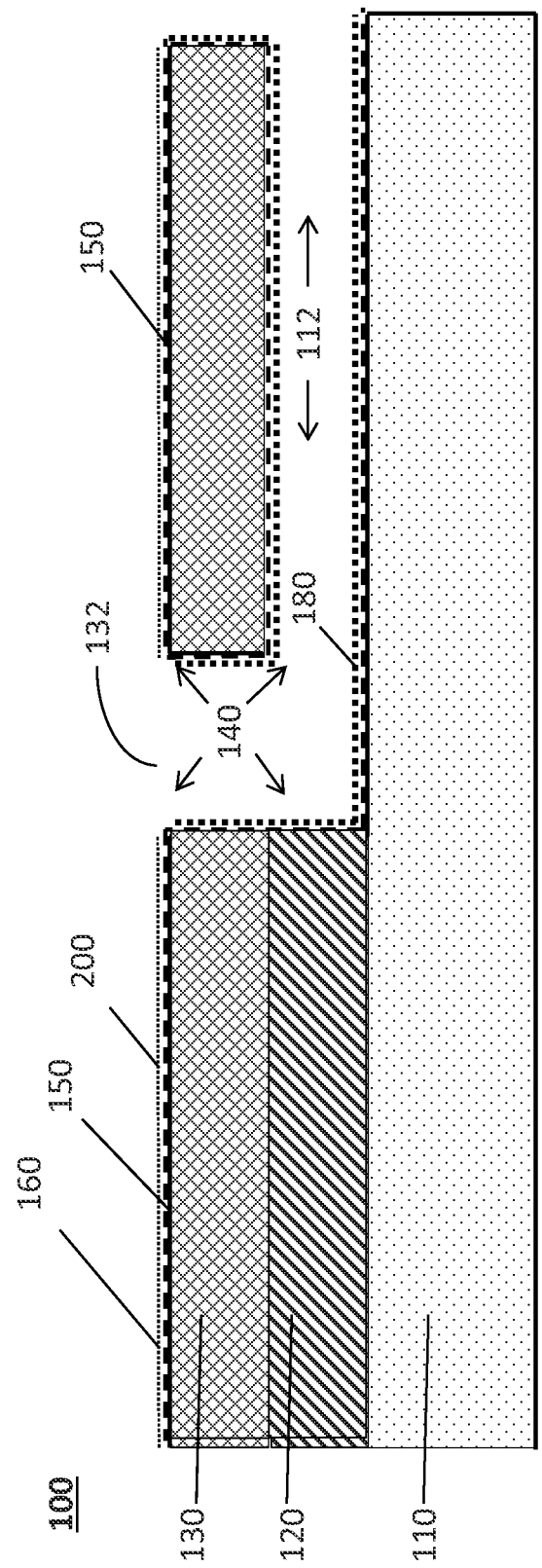
FIG. 7 is a side cross-sectional view of the ejection chip of FIG. 1 having a hydrophobic layer deposited thereon.

Turning to FIG. 7, a hydrophobic layer 200 is formed over the unreacted portions of the second layer 160. Hydrophobic layer 200 is comprised of a hydrophobic material, i.e., a material that inhibits the interaction with and/or repels fluids from its surface. In the exemplary embodiment shown, hydrophobic layer 200 may be formed of a self-assembled monolayer (SAM) comprised of a silane material, for example, ((heptadecafluoro)-1, 1, 2, 2-tetrahydrodecyl) trichlorosilane, nonofluorohexyltrimethoxysilane, n-octyltrichlorosilane, and/or ((tridecafluoro)-1, 1, 2, 2-tetrahydrooctyl) trichlorosilane, to name a few.

Accordingly, hydrophobic layer 200 adheres to the top surface of nozzle layer 130, which is at least partially encapsulated by first layer 150 and/or second layer 160, but is devoid of hydrophilic layer 180. In this manner, hydrophobic layer 200 is selectively applied to the top of nozzle layer 130, while the remaining surfaces of ejection chip 100 are coated with the hydrophilic layer 180.

In this manner, ejection chip 100 is provided having a nozzle layer 130 with an upper surface having hydrophobic properties by virtue of hydrophobic layer 200 so that liquid ink is inhibited from contacting and/or is repelled from nozzle layer 130, for example, to prevent obstruction and/or clogging of nozzle 132.

Further, ejection chip 100 is provided having a fluid chamber 140 with an outer surface having hydrophilic properties by virtue of hydrophilic layer 180 to facilitate the contact of liquid ink with fluid chamber 140, for example, to inhibit and/or reduce the presence of gaseous bubbles in the liquid ink.

In particular, a contact angle exists between a droplet of liquid ink upon contact with a surface such as the fluid chamber 114 or nozzle 130. Typically, a hydrophobic surface is associated with a higher contact angle (indicative of a tendency of the droplet of ink to spread out and/or move across the surface). The optimal contact angle of ink for a hydrophobic surface of an inkjet printhead may be, for example, a contact angle between 110 degrees and 120 degrees, and preferably 115 degrees. The optimal contact angle of ink for a hydrophilic surface of an inkjet printhead may be, for example, a contact angle of between 75 degrees and 85 degrees, and preferably 80 degrees.

It will be understood that because the first masking layer 170 prevents formation of the hydrophilic layer 180 on the nozzle layer 130, the need to remove nozzle layer 130 during application of hydrophilic layer 180, or to assemble nozzle layer 130 or an additional, untreated nozzle layer to ejection chip 100 post-application of hydrophilic layer 180 is obviated. This presents a significant reduction in time and materials needed to produce ejection chip 100 having exposed surfaces with the pattern of properties described above, and in particular, results in nozzle layer 130 having a desirable contact angle, e.g., about 115 degrees, while having a thickness between 4 and 8 microns, for example, 5 microns.

While this invention has been described in conjunction with the embodiments outlined above, it is evident that many alternatives, modifications and variations will be apparent to those skilled in the art. Accordingly, the exemplary embodiments of the invention, as set forth above, are intended to be illustrative, not limiting. Various changes may be made without departing from the spirit and scope of the invention.

What is claimed is:

1. A method of coating a fluid ejection chip, the fluid ejection chip comprising a substrate, a flow feature layer disposed over the substrate, and a nozzle layer comprising one or more nozzles disposed over the flow feature layer, the method comprising:

forming a first layer over the fluid ejection chip;
forming a second layer over the first layer;
applying, after forming the second layer, a first masking layer in substantially planar abutment with a top surface of the nozzle layer to form a covered surface of the fluid ejection chip that is covered by the first masking layer and to form exposed surfaces of the fluid election chip;

forming hydrophilic layer at the exposed surfaces of the fluid election chip;

reacting the hydrophilic layer with the second layer to form a uniform layer that encapsulates portions of the fluid ejection chip at the exposed surfaces;

removing the first masking layer after the reacting; and forming, after forming the hydrophilic layer, a hydrophobic layer at one or more portions of the top surface of the nozzle layer.

2. The method of claim 1, wherein the hydrophilic layer is a self-assembled monolayer.

3. The method of claim 1, wherein the step of forming the first layer comprises at least one of chemical vapor deposition (CVD), sputtering, spin coating, plasma deposition, atomic deposition, or physical vapor deposition (PVD).

4. The method of claim 1, wherein the hydrophilic layer comprises a silane material.

5. The method of claim 1, wherein the step of forming the second layer comprises at least one of chemical vapor deposition (CVD), sputtering, spin coating, plasma deposition, atomic deposition, or physical vapor deposition (PVD).

6. The method of claim 1, further comprising the step of applying a second masking layer to a bottom surface of the substrate following removal of the first masking layer.

7. The method of claim 6, further comprising the step of removing the second masking layer after formation of the hydrophobic layer.

8. The method of claim 1, wherein the step of removing the first masking layer results in exposure of a portion of the nozzle layer that is devoid of the hydrophilic layer.

\* \* \* \* \*